(12) United States Patent
Radkov et al.

(10) Patent No.: US 9,954,145 B2
(45) Date of Patent: Apr. 24, 2018

(54) WHITE LIGHT APPARATUS WITH ENHANCED COLOR CONTRAST

(71) Applicant: GE Lighting Solutions, LLC, East Cleveland, OH (US)

(72) Inventors: Emil Vergilov Radkov, Euclid, OH (US); Ilona Elisabeth Hausmann, Elyria, OH (US); Derek Allen Publicover, Shaker Heights, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 0 days.

(21) Appl. No.: 14/295,486

(22) Filed: Jun. 4, 2014

(65) Prior Publication Data

US 2014/0285996 A1    Sep. 25, 2014

Related U.S. Application Data

(63) Continuation of application No. 11/810,024, filed on Jun. 4, 2007, now abandoned, which is a continuation-in-part of application No. 11/285,122, filed on Nov. 22, 2005, now Pat. No. 7,453,195, which is a continuation-in-part of application No. 10/909,564, filed on Aug. 2, 2004, now Pat. No. 7,768,189.

(51) Int. Cl.
| | |
|---|---|
| *H01L 33/44* | (2010.01) |
| *H01L 33/50* | (2010.01) |
| *C09K 11/08* | (2006.01) |
| *C09K 11/66* | (2006.01) |
| *C09K 11/77* | (2006.01) |
| *F21K 9/64* | (2016.01) |

(52) U.S. Cl.
CPC ........ *H01L 33/502* (2013.01); *C09K 11/0883* (2013.01); *C09K 11/665* (2013.01); *C09K 11/774* (2013.01); *C09K 11/778* (2013.01); *C09K 11/7731* (2013.01); *C09K 11/7734* (2013.01); *C09K 11/7736* (2013.01); *C09K 11/7738* (2013.01); *C09K 11/7739* (2013.01); *C09K 11/7766* (2013.01); *C09K 11/7786* (2013.01); *C09K 11/7787* (2013.01); *C09K 11/7789* (2013.01); *C09K 11/7794* (2013.01); *F21K 9/64* (2016.08); *H01L 33/44* (2013.01); *H01L 33/507* (2013.01); *H01L 2224/48091* (2013.01); *H01L 2224/48247* (2013.01); *H01L 2924/12044* (2013.01); *Y02B 20/181* (2013.01)

(58) Field of Classification Search
CPC ............................... H01L 33/44; H01L 33/50
USPC ......................................................... 313/485
See application file for complete search history.

(56) References Cited

U.S. PATENT DOCUMENTS

| | | | |
|---|---|---|---|
| 8,646,926 B2* | 2/2014 | Manabe | F21V 3/04 257/98 |
| 2004/0119086 A1* | 6/2004 | Yano et al. | 257/98 |
| 2005/0189863 A1* | 9/2005 | Nagatomi et al. | 313/486 |

* cited by examiner

*Primary Examiner* — Christopher Raabe
(74) *Attorney, Agent, or Firm* — Fay Sharpe LLP (57) ABSTRACT

A lighting apparatus for emitting white light including a semiconductor light source emitting radiation with a peak emission between from about 250 nm to about 500 nm and a first phosphor having a peak emission between about 550 and 615 nm, wherein an overall emission spectrum of the lighting apparatus has a depression between about 550 and 615 nm, whereby the red-green color contrast is increased versus a reference illuminant.

32 Claims, 10 Drawing Sheets

WHITE LIGHT APPARATUS WITH ENHANCED COLOR CONTRAST

This application is a continuation of U.S. patent application Ser. No. 11/810,024 filed Jun. 4, 2007 which is a continuation-in-part of commonly assigned U.S. patent application Ser. No. 11/285,122, filed on Nov. 22, 2005, which is a continuation-in-part of U.S. patent application Ser. No. 10/909,564, filed on Aug. 2, 2004, and claims the benefit of the priority dates thereof, the disclosures of each of the applications is herein incorporated by reference.

BACKGROUND OF THE INVENTION

The present exemplary embodiments relate to lighting devices incorporating one or more phosphors for the conversion of radiation emitted by a light source. They find particular application in conjunction with converting LED-generated ultraviolet (UV), violet or blue radiation into white light for general illumination purposes. It should be appreciated, however, that the invention is also applicable to the conversion of radiation in other applications, such as Hg-based fluorescent lamps, mercury-free gas discharge lamps, metal halide lamps, UV, violet and/or blue lasers, as well as other white light sources for different applications.

Light emitting diodes (LEDs) are semiconductor light emitters often used as a replacement for other light sources, such as incandescent lamps. They are particularly useful as display lights, warning lights and indicator lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). With reference to the GaN-based LEDs, light is generally emitted in the UV to green range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Continuous performance improvements have enabled new applications for LEDs of saturated colors in traffic lights, exit signs, store signs, and the like.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complementary color, e.g. a yellowish emission. Together, the blue and yellowish radiation produces a white light. There are also white LEDs that utilize a near UV emitting chip and a phosphor blend including red, green and blue emitting phosphors designed to convert the UV radiation to visible light.

Known white light emitting devices comprise a blue light-emitting LED having a peak emission wavelength in the near blue range (from about 440 nm to about 480 nm) combined with a yellow light-emitting phosphor, such as cerium(III) doped yttrium aluminum garnet ("YAG:Ce"), a cerium(III) doped terbium aluminum garnet ("TAG:Ce"), or a europium(II) doped barium orthosilicate ("BOS"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light as a white light. The total of the light from the phosphor material and the LED chip provides a color point with corresponding color coordinates (x and y) and correlated color temperature (CCT), and its spectral distribution provides a color rendering capability, measured by the color rendering index (CRI).

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature. As used herein, "CRI" is used to refer to any of the above general, mean, or special values unless otherwise specified.

Incandescent lamps are known to generate a considerable amount of light in the yellow region of the spectrum, leading to "washing out" of the colors of objects illuminated by them. In response to this, methods have been developed to filter out part of the yellow light through the use of the rare earth element neodymium in the glass envelope. Examples of such lighting systems include the line of REVEAL™ light bulbs produced by GE.

Figure 5:
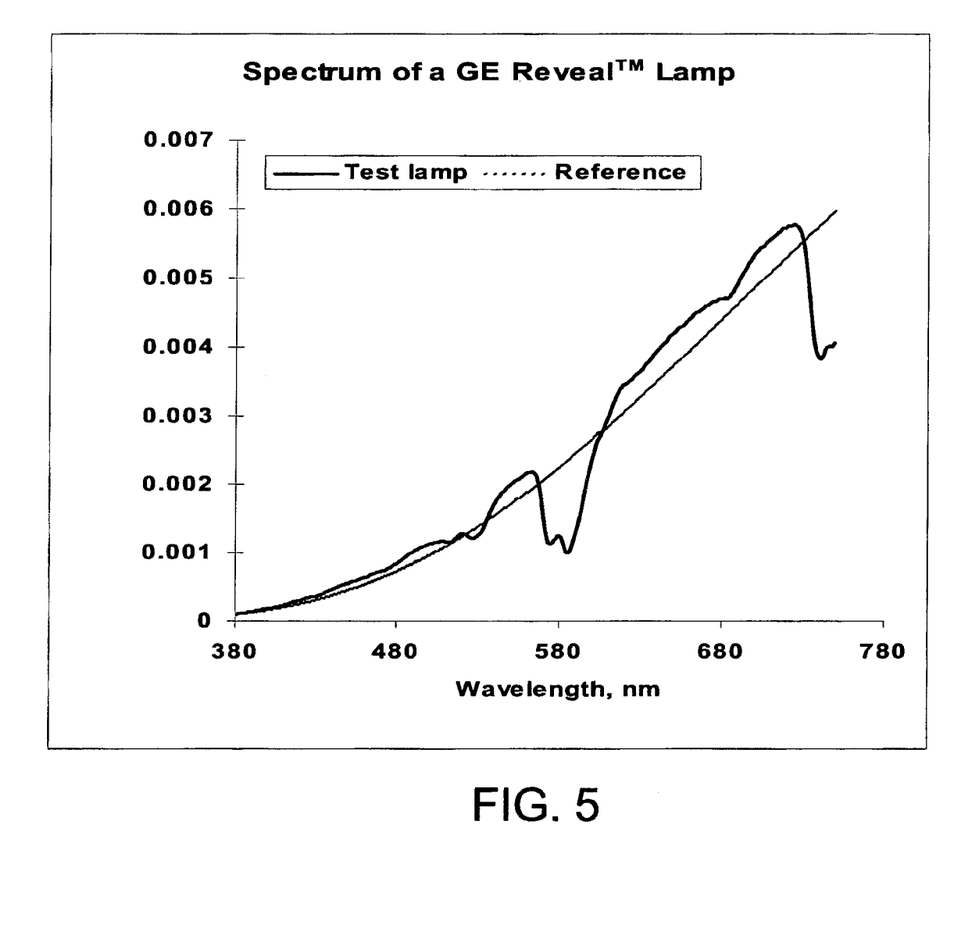
FIG. 5 shows the power spectrum for a GE Reveal™ lamp versus that of a reference CIE illuminant of the same CCT.

A salient feature of the spectrum of REVEAL™ bulbs is the deep depression in the yellow region, resulting from the filtration by the neodymium glass, as shown in FIG. 5 (solid line). This yellow depression does not extend to zero spectral intensity, but only to about 15% of the highest intensity of the spectrum between 400 and 700 nm. As a result, the REVEAL™ bulbs have a deficiency in the yellow part of the spectrum versus the reference illuminant (shown as a dashed line in FIG. 5). This deficiency leads to increased red-green color contrast when objects are viewed under this lamp, in comparison to a regular incandescent bulb. This has been found to be very appealing to customers.

In the area of LEDs, white phosphor-converted LEDs are based primarily on yellow emitting phosphors, in order to maximize their lumen output. This however reduces the red-green color contrast for test samples of different colors. One way to enhance that contrast (addressed in commonly owned co-pending U.S. patent application Ser. No. 11/285, 122) is to use a blend comprising red and green phosphors containing a depression in the yellow region of their combined emission spectrum. Despite the high inherent efficiency, a problem with this solution is its complexity, stemming from the need to use red and green phosphors with sufficient wavelength separation to create the requisite depression in the yellow region, plus an optional variable amount of yellow phosphor to modulate the red-green color contrast enhancement and trade off the latter effect against the loss in luminous efficacy. The invention described herein overcomes this problem by a simpler solution, with the unexpected additional benefit of increased $R_a$ in some cases.

Thus, a continuing need exists to develop new, preferably LED based, lighting devices with enhanced red-green color contrast compared to state of the art solutions.

BRIEF SUMMARY

In a first aspect, there is provided a lighting apparatus for emitting white light having enhanced red-green color contrast, including a light source emitting radiation with a peak in the range of from about 250 nm to about 500 nm; a phosphor material having a peak emission between 550 and 615 nm; and a filter that prevents a portion of radiation emitted by the phosphor material from being emitted by the apparatus while substantially permitting the emission of radiation from the lighting apparatus in emission wavelengths other than between 550 and 615 nm.

In a second aspect, there is provided a method for making a lighting apparatus for emitting white light having enhanced red-green color contrast, the method including the steps of providing a light source emitting radiation having a peak emission at from about 250 to 500 nm; providing a phosphor material having a peak emission between 550 and 615 nm radiationally coupled to the light source; and providing a filter that prevents a portion of radiation emitted by the phosphor material from being emitted by the apparatus while substantially permitting the emission of radiation from the lighting apparatus in emission wavelengths other than between 550 and 615 nm.

DETAILED DESCRIPTION OF THE PREFERRED EMBODIMENTS

Phosphors convert radiation (energy) to visible light. Different combinations of phosphors provide different colored light emissions. Novel phosphor materials and blends are presented herein as well as their use in LED and other light sources.

The color of the generated visible light is dependent on the particular components of the phosphor material. The phosphor material may include only a single phosphor compound or two or more phosphors of basic color, for example a particular mix with one or more of a yellow and red phosphor to emit a desired color (tint) of light. As used herein, the terms "phosphor" and "phosphor material" may be used to denote both a single phosphor compound as well as a blend of two or more phosphors.

It was determined that a lighting apparatus or device that produces a white light with enhanced red-green color contrast would be useful to impart desirable qualities to light sources, preferably LED based. Therefore, in one embodiment, a luminescent material phosphor conversion material blend (phosphor blend) coated LED chip and a filter is disclosed for providing such light. The phosphor blends presented in this embodiment enable white light with an optimal combination of CRI and LER at any CCT of interest, when excited by radiation from about 250 to 550 nm as emitted by a near UV to green LED.

Figure 1:
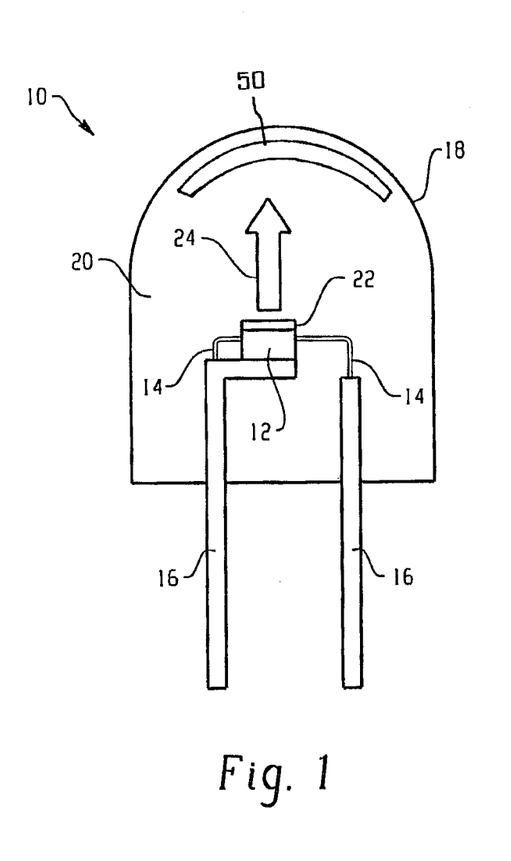
FIG. 1 is a schematic cross-sectional view of a prior art phosphor converted LED illumination system.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self-supported electrodes and the lead frame may be omitted. The leads 14 provide current to the LED chip 12 and thus cause the LED chip 12 to emit radiation.

The lamp may include any visible or UV light source that is capable of producing white light when its emitted radiation is directed onto the phosphor. One preferred light source is a semiconductor source such an LED chip or an OLED. The preferred peak emission of the LED chip in the present invention will depend on the identity of the phosphors in the disclosed embodiments and may range from, e.g., 250-550 nm. In one preferred embodiment, however, the emission of the LED will be in the near UV to blue-green region and have a peak wavelength in the range from about 370 to about 500 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 250 to 550 nm.

Preferably, the LED may contain at least one semiconductor layer comprising GaN, AlN or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 550 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other material having a high index of refraction. In one embodiment, the encapsulant material 20 is a polymer material, such as epoxy, silicone, or silicone epoxy, although other organic or inorganic encapsulants may be used. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so that at least part of the radiation emitted from one is transmitted to the other.

This phosphor material 22 is deposited on the LED 12 by any appropriate method. For example, a suspension of the phosphor(s) can be formed, and applied as a phosphor layer to the LED surface. In one such method, a silicone, epoxy or other matrix material is used (either directly or diluted with an organic solvent, e.g. acetone, MIBK or butyl acetate) to create a slurry in which the phosphor particles are randomly suspended and placed around the LED. This method is merely exemplary of possible positions of the phosphor material 22 and LED 12. Thus, the phosphor material 22 may be coated over or directly on the light emitting surface of the LED chip 12 by coating and drying or curing the phosphor suspension over the LED chip 12. Both the shell 18 and the encapsulant 20 should be transparent to allow light 24 to be transmitted through those elements. Although not intended to be limiting, the median particle size of the phosphor material as measured using light scattering methods or via microscope (electron or optical) measurements may be from about 1 to about 20 microns.

A filter 50 is positioned to absorb at least part of the radiation emitted by the phosphor material. The filter is described in more detail below. Like the phosphor material itself, the position of the filter can vary, so long as at least part of the radiation emitted by the phosphor material strikes and is absorbed by the filter prior to its emission from the lighting device. Thus, as shown in FIG. 1, the filter may be positioned in the encapsulant 20. Alternately, the filter can be positioned on a surface of the encapsulant or shell, positioned directly on the phosphor material, created by embedding or coating light absorbing particles into or onto the LED etc.

Figure 2:
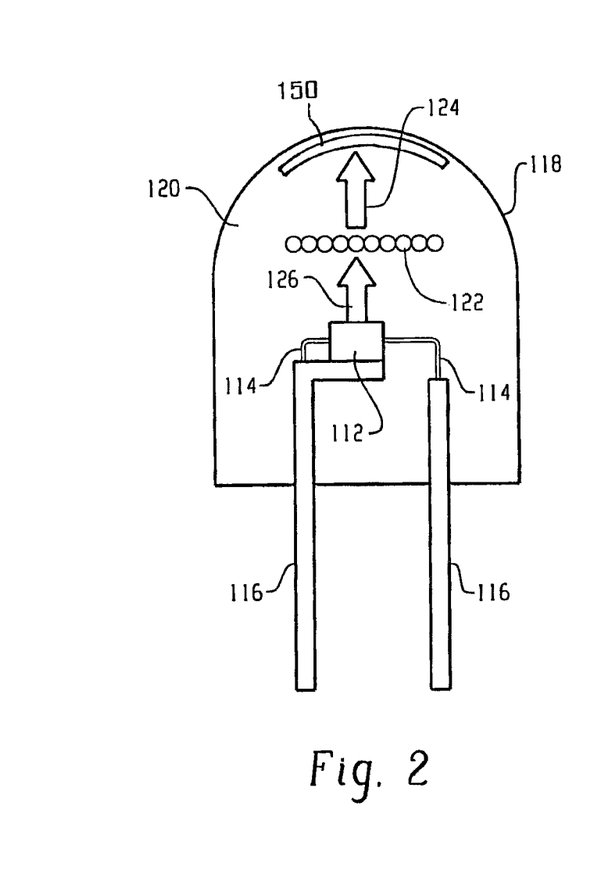
FIG. 2 is a schematic sectional view of an LED device in accord with a first embodiment.

FIG. 2 illustrates a second preferred structure of the system according to the preferred aspect of the present invention. Corresponding numbers from FIGS. 1-4 (e.g. 12 in FIGS. 1 and 112 in FIG. 2) relate to corresponding structures in each of the figures unless otherwise stated. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer molding. Again, a filter 150 is positioned over the phosphor material to absorb at least a portion of the radiation emitted therefrom. The filter should have certain properties as described further below and can be made in the same fashion as described in the preceding paragraph.

Figure 3:
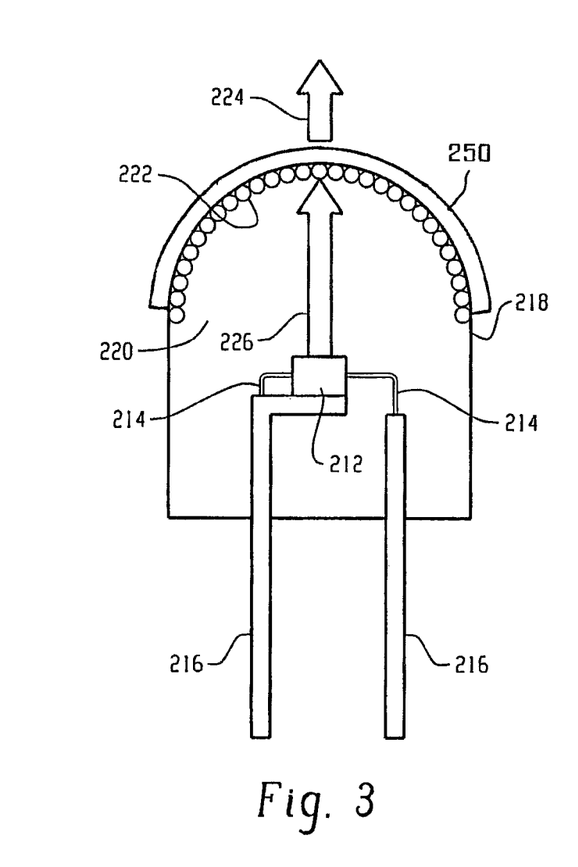
FIG. 3 is a schematic sectional view of an LED device in accord with a second embodiment.

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. The filter 250 can be positioned on a surface of the shell in this case. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles (such as alumina powder) or $TiO_2$ particles. The scattering particles effectively scatter the coherent light emitted from the LED chip, preferably with a negligible amount of absorption.

Figure 4:
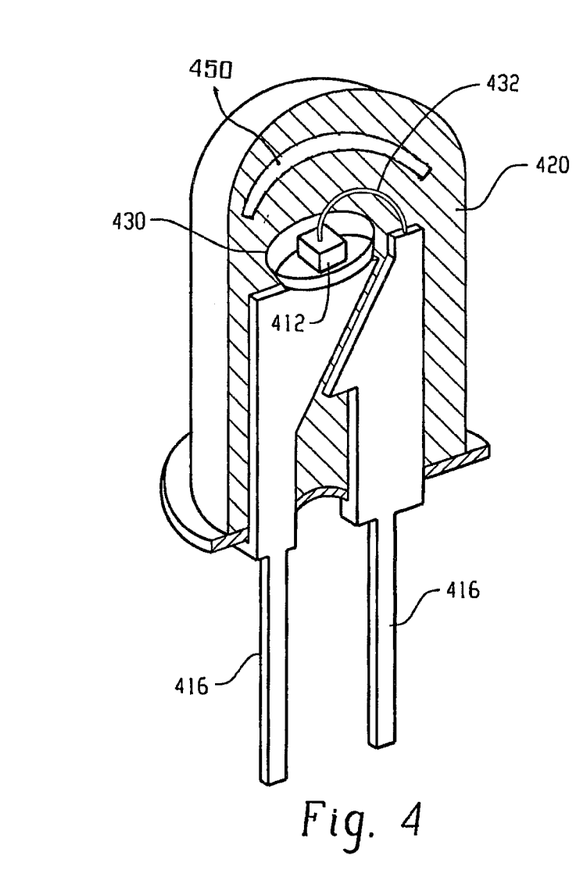
FIG. 4 is a schematic sectional view of an LED device in accord with a third embodiment.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, an encapsulant material 420, and a filter 450.

In one embodiment, there is provided a lighting device incorporating an LED having a peak emission in the range from about 370 to about 500 nm, a yellow emitting phosphor and a filter such as outlined above. In another embodiment, in addition to the yellow emitting phosphor, the phosphor material includes a blend of at least one additional phosphor having a peak emission between about 615 and 670 nm, and an optional second additional phosphor having a peak emission between about 450 and 550 nm, to provide color balance if the LED chip peak emission is less than 450 nm. In such an embodiment, the LED may have an emission peak in the near UV to blue region.

By "depression", it is meant that the combined emission spectrum of the lighting apparatus, which is the combined emission of the phosphor(s) present in the device as well as any residual LED (or other source) emission bleed, has a relatively decreased emission intensity in the specified wavelength range. This depression is not necessarily an absolute intensity minimum over the entire emission spectrum, but merely a region where the emission intensity reaches a local minimum in the yellow range between about 550 and 615 nm. The emission intensity does not need to reach zero (or baseline level) at the lowest depression point, but should drop to between about 5% and 25%, more preferably between about 10% and 20%, of the highest intensity of the emission spectrum of the lighting apparatus in the region from 400 to 700 nm. Thus, the salient feature of the spectrum of a REVEAL™ bulb is approximated.

The first phosphor can be any yellow emitting phosphor having a peak emission in the range of from about 550 to 615 nm when excited by radiation from the light source, part of which can be absorbed by a filter, thereby creating a depression in the overall power spectrum of the LED as described further below. Examples of such phosphor materials are garnets (YAG and TAG) doped with Ce(III), silicates doped with Eu(II) such as BOS, and their various compositional modifications known in the art.

As detailed above, the excitation source in one embodiment is a UV to blue light emitting LED. Thus, the phosphors are preferably efficient absorbers in this range. Phosphors that satisfy this requirement are known.

The yellow narrow band filter may be any type of filter that can effectively absorb or otherwise filter out at least a portion of the radiation emitted by the yellow phosphor, while substantially permitting the emission of radiation from the lighting apparatus in emission wavelengths other than between 550 and 615 nm. Thus the overall power spectrum of the apparatus will exhibit a depression between about 550 and 615 nm, said depression extending to between about 5% and 25%, more preferably between about 10% and 20% of the highest intensity of the emission spectrum of the lighting apparatus in the region from 400 to 700 nm.

A particularly preferred material for making the filter described above is neodymium (a.k.a. didymium) glass with $Nd_2O_3$ content between 1 and 10% by weight (e.g. as described in U.S. Pat. No. 6,358,873), used either as a layer with a thickness e.g. between 0.3 and 5 mm, more preferably between 0.5 and 1.5 mm, or in powder form as a pigment for incorporation into (or coating onto) an LED opposite to the chip from the phosphor. Other suitable materials include, but are not limited to, neodymium(III) doped silicates, phosphates, aluminates, borates and ceramics.

As noted above, additional phosphors can also be included. Thus, a phosphor having a peak emission between about 450 and 550 nm when excited with radiation from the excitation source may also be included if an LED chip with peak emission less than 450 nm is used, as needed to achieve an overall white spectrum with a requisite CCT value. Multiple emission peaks in the same range are also acceptable, as shown in the examples. Exemplary, but non-limiting examples of suitable phosphors for use with the first phosphor material in the present embodiments include, for example, $(Mg,Ca,Sr,Ba,Zn)_5(PO_4)_3(F,Cl,Br,OH):Eu^{2+}$, $Sr_4Al_{14}O_{25}:Eu^{2+}$, $(Ca,Sr,Ba)Al_2O_4:Eu^{2+}$, and $(Ca,Sr,Ba)MgAl_{10}O_{17}:Eu^{2+},Mn^{2+}$.

It should be noted that various phosphors are described herein in which different elements enclosed in parentheses and separated by commas, such as in the above $(Ca,Sr,Ba)Al_2O_4:Eu^{2+}$ phosphor. As understood by those skilled in the art, this type of notation means that the phosphor can include any or all of those specified elements in the formulation in any ratio. That is, this type of notation for the above phosphor, for example, has the same meaning as $(Ca_{1-a-b}Sr_aBa_b)Al_2O_4:Eu^{2+}$, wherein $0 \le a,b \le 1$.

Another additional phosphor may include those having a peak emission between about 615 and 670 nm when excited with radiation from the excitation source. Multiple emission peaks in the same range are also acceptable, as shown in the examples. As detailed above, the LED in one embodiment is a UV to blue light emitting LED. Thus, the phosphors are preferably efficient absorbers in this range. Phosphors that satisfy this requirement are known. Exemplary, but non-limiting examples of suitable phosphor compounds for use as the second phosphor material in the present embodiments include, for example, $3.5MgO*0.5MgF_2*GeO_2:Mn^{4+}$, $Ca_{1-2e-f}Ce_e(Li,Na)_eEu_fAlSiN_3$, where $0 \le e \le 0.2$, $0 \le f \le 0.2$, $e+f>0$; or $Ca_{1-g-h-i}Ce_g(Li,Na)_hEu_iAl_{1+g-h}Si_{1-g+h}N_3$ where $0 \le g \le 0.2$, $0 < h \le 0.4$, $0 \le i \le 0.2$, $g+i>0$; $CaAlSiN_3:Eu^{2+}$ and $A_2[MF_6]:Mn^{4+}$ where A=Li, Na, K, Rb or Cs and M=Ge, Si, Sn, Ti or Zr.

In addition, other phosphors emitting throughout the visible spectrum region, at wavelengths substantially different from those of the phosphors described in the present invention, may be used in the blend to customize the white color of the resulting light and produce sources with improved light quality. While not intended to be limiting, suitable phosphors for use in the blend with the present phosphors include:

$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$(Sr,Ca)_{10}(PO_4)_6*vB_2O_3:Eu^{2+}$ (wherein $0<v \le 1$)
$Sr_2Si_3O_8*2SrCl_2:Eu^{2+}$
$(Ca,Sr,Ba)_3MgSi_2O_8:Eu^{2+},Mn^{2+}$
$BaAl_8O_{13}:Eu^{2+}$
$2SrO*0.84P_2O_5*0.16B_2O_3:Eu^{2+}$
$(Ba,Sr,Ca)MgAl_{10}O_{17}:Eu^{2+},Mn^{2+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2Si_{1-\xi}O_{4-2\xi}:Eu^{2+}$ (wherein $0 \le \xi \le 0.2$)
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr,Lu)_3(Sc,Al,Ga)_{5-\alpha}O_{12-3/2\alpha}:Ce^{3+}$ (wherein $0 \le \alpha \le 0.5$)
$(Lu,Sc,Y,Tb)_{2-u-v}Ce_vCa_{1+u}Li_wMg_{2-w}P_w(Si,Ge)_{3-w}O_{12-u/2}$ where $-0.5 \le u \le 1$; $0 < v \le 0.1$; and $0 \le w \le 0.2$
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$ZnS:Cu^+,Cl^-$
$ZnS:Cu^+,Al^{3+}$
$ZnS:Ag^+,Cl^-$
$ZnS:Ag^+,Al^{3+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$(Ba,Sr,Ca)_6Si_\gamma N_\mu:Eu^{2+}$ (wherein $2\beta+4\gamma=3\mu$)
$Ca_3(SiO_4)Cl_2:Eu^{2+}$ $(Y,Lu,Gd)_{2-\varphi}Ca_{\varphi}Si_4N_{6+\varphi}C_{1-\varphi}:Ce^{3+}$, (wherein $0\leq\varphi\leq0.5$)

$(Lu,Ca,Li,Mg,Y)$alpha-SiAlON doped with $Eu^{2+}$ and/or $Ce^{3+}$ $(Ca,Sr,Ba)SiO_2N_2:Eu^{2+},Ce^{3+}$ $3.5MgO*0.5MgF_2*GeO_2:Mn^{4+}$ $Ca_{1-c-f}Ce_cEu_fAl_{1+c}Si_{1-c}N_3$, (where $0<c\leq0.2$, $0\leq f\leq0.2$)

$Ca_{1-h-r}Ce_hEu_rAl_{1-h}(Mg,Zn)_hSiN_3$, (where $0<h\leq0.2$, $0\leq r\leq0.2$)

$Ca_{1-2s-t}Ce_s(Li,Na)_sEu_tAlSiN_3$, (where $0\leq s\leq0.2$, $0\leq f\leq0.2$, $s+t>0$)

$Ca_{1-o-\chi-\varphi}Ce_o(Li,Na)_\chi Eu_\varphi Al_{1+o-\chi}Si_{1-o+\chi}N_3$, (where $0\leq o\leq0.2$, $0<\chi\leq4$, $0\leq\varphi\leq0.2$)

For purposes of the present application, it should be understood that when a phosphor has two or more dopant ions (i.e. those ions following the colon in the above compounds), this is to mean that the phosphor has at least one (but not necessarily all) of those dopant ions within the material. That is, as understood by those skilled in the art, this type of notation means that the phosphor can include any or all of those specified ions as dopants in the formulation.

It will be appreciated by a person skilled in the art that other phosphor compounds with sufficiently similar emission spectra may be used instead of any of the preceding suitable examples, even though the chemical formulations of such substitutes may be significantly different from the aforementioned examples.

The specific amounts of the individual phosphor compounds used in the phosphor material will depend upon the desired color temperature. The relative amounts of each phosphor in the phosphor materials can be described in terms of spectral weight. The spectral weight is the relative amount that each phosphor contributes to the overall emission spectrum of the phosphor material. Additionally, part of the LED light may be allowed to bleed through and contribute to the light spectrum of the device if necessary. The amount of LED bleed can be adjusted by changing the optical density of the phosphor layer, as routinely done for industrial blue chip based white LEDs. Alternatively, it may be adjusted by using a suitable filter or a pigment, as described further below.

The spectral weight amounts of all of the phosphors and any residual bleed from the LED source should add up to 100% of the emission spectrum of the light device.

When the phosphor material includes a blend of two or more phosphors, the ratio of each of the individual phosphors in the phosphor blend may vary depending on the characteristics of the desired light output. The relative proportions of the individual phosphors in the various embodiment phosphor blends may be adjusted such that when their emissions are blended and employed in an lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. Preferably, the color point of the white light will lie on or substantially on the Planckian (also known as the blackbody) locus, e.g. within 0.020 units in the vertical (y) direction of the CIE 1931 chromaticity diagram, more preferably within 0.010 units in the vertical direction. As stated, however, the identity and amounts of each phosphor in the phosphor material can be varied according to the needs of the end user. Since the efficiency of individual phosphors may vary widely between suppliers, the exact amounts of each phosphor needed are best determined empirically, e.g. through standard design of experiment (DOE) techniques.

The above described phosphor compounds may be produced using known solid state reaction processes for the production of phosphors by combining, for example, elemental oxides, carbonates and/or hydroxides as starting materials. Other starting materials may include nitrates, sulfates, acetates, citrates, or oxalates. In a typical process, the starting materials are combined via a dry or wet blending process and fired in air or under a reducing atmosphere at from, e.g., 900 to 1600° C.

It may be desirable to add pigments or filters to the lighting device to absorb or remove emission of any residual LED bleed. When the LED is a UV emitting LED, the device may also comprise from 0 up to about 10% by weight (based on the total weight of the phosphors) of a pigment or other UV absorbent material capable of absorbing or reflecting UV or other radiation from the LED.

Suitable pigments or filters include any of those known in the art that are capable of absorbing radiation generated between 200 nm and 450 nm. Such pigments include, for example, nickel titanate or praseodymium zirconate. The pigment may be used in an amount effective to filter 10% to 100% of the radiation generated by the LED.

One can create spectral blends for use in each phosphor material to cover the relevant portions of color space, especially for white lamps. Specific examples of this are shown below. For various desired color points, one can determine the identity and appropriate amounts of each phosphor compound to include in the phosphor material. Thus, one can customize phosphor blends for use in the embodiments to produce almost any CCT or color point, with control over the CRI and luminosity based on the amount of each phosphor in the lighting device.

One feature of the present invention is the use of a white LED containing at least one yellow emitting phosphor in conjunction with a narrow band filter, e.g. Nd glass. The resulting partial elimination of the yellow emission leads to increased red-green contrast in the LED, with a slight change in color coordinates, as shown in the examples below. The extent of the effect can be adjusted e.g. by increasing or decreasing the thickness of the filter, the Nd content, or both. When using LEDs with high (90+) CRI, the CRI drops and the filtered light of the LEDs shows red-green contrast greater than that of the CIE reference source, similarly to the REVEAL™ lamps. Unexpectedly, the opposite effect on CRI is observed when using the same Nd glass filter on LEDs with low CRI.

The narrow band filter (such as a Nd glass) described above may also be used as part of a fixture enclosing the lighting apparatus described herein. This fixture could be adjacent the lighting apparatus or spaced apart therefrom, as individual design may warrant. This would allow, for example, one to modify the extent of the red-green color contrast enhancement by using filters with higher or lower thickness, Nd content, etc., as explained in the preceding paragraph.

By use of the present embodiments wherein one or more phosphors with the specified emission ranges are used in a lighting device along with a narrow band yellow filter, which has an overall emission spectrum with a depression between about 550 and 615 nm, lamps can be provided having customizable CRI and luminosity for a given color point. The preparation of the phosphor material, including the identity and amounts of each phosphor compound present therein, and the evaluation of its contribution to the LED spectrum can be done using established techniquest aided by, e.g., the DOE approach.

EXAMPLES

Various LED based light devices based on violet chip with emission maximum near 405 nm and using phosphor blends according to the above embodiments were investigated and compared to identical light sources also including a Nd glass filter of average thickness 1 mm and containing 7.5% $Nd_2O_3$ by weight. A summary of photometric characteristics (luminous flux $I_v$, 1931 CIE coordinates x and y, CCT and CRI values) of these devices is shown in Table 1. The yellow phosphor used in LED samples 1 through 10 was an alkali earth silicate doped with Eu(II) and corresponding to the formula $Sr_{1.66}Ca_{0.30}Eu_{0.04}Si_{0.96}O_{3.92}$. The blue and green phosphors $(Ca,Sr,Ba)_5(PO_4)_3Cl:Eu^{2+}$, $(Ba_{0.65}Sr_{0.20}Ca_{0.10}Eu_{0.05})_2SiO_4$ and $Sr_4Al_{14}O_{25}:Eu^{2+}$ were also used, as needed to achieve the requisite CCTs ranging from 2500 to 7500K prior to filtration. In addition, sample #7 contained a deep red line emitting phosphor $(3.5MgO*0.5MgF_2*GeO_2:Mn^{4+})$ whereas samples #4-#6 and #8-#10 contained a deep red broadband phosphor $(Ca_{0.88}Eu_{0.02}Li_{0.1}Al_{0.9}Si_{1.1}N_3)$, in order to attain high (e.g. greater than 90) starting $R_a$ values.

TABLE 1

| Item | Source | $I_v$ (lm) | x | y | CCT (K) | $R_a$ |
|---|---|---|---|---|---|---|
| 1 | GE Reveal ™ 25W | 133 | 0.467 | 0.402 | 2531 | 79 |
| 2 | LED sample #1 | 137 | 0.469 | 0.430 | 2721 | 66 |
| 3 | Same w. Nd glass | 105 | 0.460 | 0.421 | 2780 | 80 |
| 4 | LED sample #2 | 174 | 0.418 | 0.418 | 3448 | 69 |
| 5 | Same w. Nd glass | 131 | 0.401 | 0.407 | 3732 | 82 |
| 6 | LED sample #3 | 170 | 0.373 | 0.376 | 4203 | 78 |
| 7 | Same w. Nd glass | 132 | 0.353 | 0.359 | 4746 | 91 |
| 8 | LED sample #4 | 95 | 0.484 | 0.416 | 2437 | 92 |
| 9 | Same w. Nd glass | 75 | 0.479 | 0.405 | 2404 | 89 |
| 10 | LED sample #5 | 109 | 0.466 | 0.413 | 2636 | 93 |
| 11 | Same w. Nd glass | 86 | 0.460 | 0.401 | 2631 | 87 |
| 12 | LED sample #6 | 111 | 0.432 | 0.395 | 3015 | 93 |
| 13 | Same w. Nd glass | 88 | 0.421 | 0.381 | 3079 | 86 |
| 14 | LED sample #7 | 75 | 0.393 | 0.387 | 3756 | 97 |
| 15 | Same w. Nd glass | 60 | 0.381 | 0.372 | 3952 | 80 |
| 16 | LED sample #8 | 112 | 0.337 | 0.348 | 5296 | 98 |
| 17 | Same w. Nd glass | 90 | 0.322 | 0.330 | 6012 | 85 |
| 18 | LED sample #9 | 113 | 0.314 | 0.334 | 6381 | 97 |
| 19 | Same w. Nd glass | 91 | 0.299 | 0.316 | 7475 | 87 |
| 20 | LED sample #10 | 117 | 0.300 | 0.320 | 7351 | 98 |
| 21 | Same w. Nd glass | 94 | 0.284 | 0.301 | 9044 | 89 |

Figure 6:
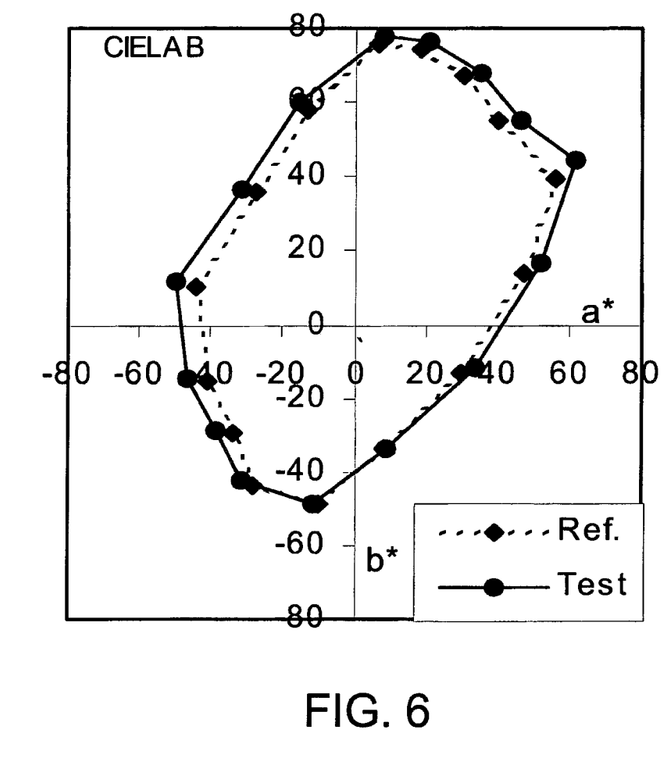
FIG. 6 shows the color coordinates of 15 test color samples in CIELAB color space for the GE Reveal™ lamp spectrum from FIG. 5 versus those for the reference CIE illuminant.

FIG. 6 demonstrates the effect of a Nd glass filtration in a Reveal™ lamp (solid line) on the appearance of 15 test color samples proposed by NIST in CIE space, compared to that of the same samples under a reference illuminant (dashed line). Reference illuminants are spectra of a blackbody radiator with the same CCT (if the latter is below 5000K), or of a simulated daylight spectra with the same CCT (if the latter is at or above 5000K), as specified internationally in: CIE Method of Measuring and Specifying Colour Rendering Properties of Light Sources, CIE 13.3 (1995). It should be noted that the filtration by Nd glass has an effect of enlarging the color differences along the a* axis in CIELAB color space, corresponding to increased red-green color contrast versus the reference illuminant. A side effect of this increased contrast is a drop in the CRI value from 100 (for an unfiltered incandescent lamp) to less than 80 (as shown for Item 1 in Table 1; also in Y. Ohno, Color Rendering and Luminous Efficacy of White LED Spectra, in *Fourth International Conference on Solid State Lighting*, edited by I. T. Ferguson, N. Narendran, S. DenBaars, and J. C. Carrano, Proc. SPIE 5530, 88-98, 2004).

Figure 8A:
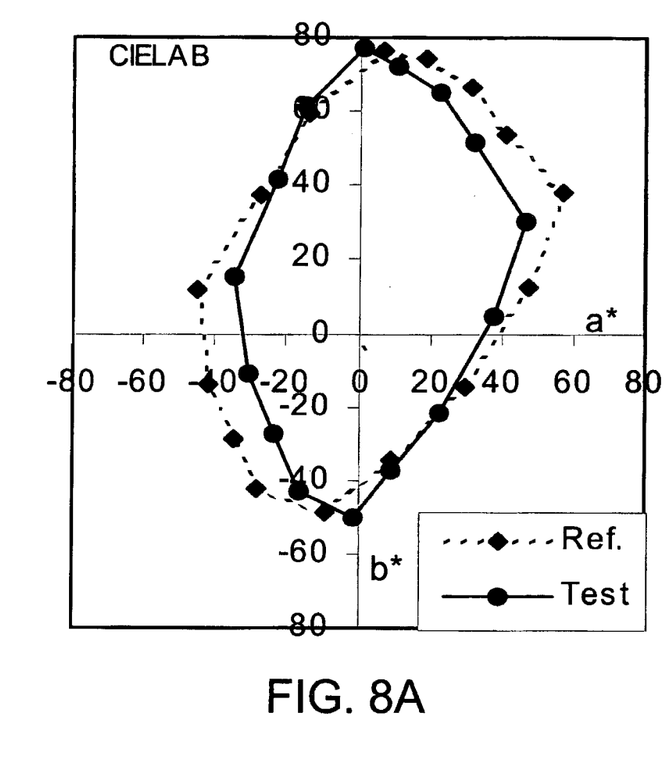
FIGS. 8A and 8B show the color coordinates of 15 test color samples in CIELAB color space for both spectra from FIG. 7 versus those for a reference CIE illuminant.
Figure 8B:
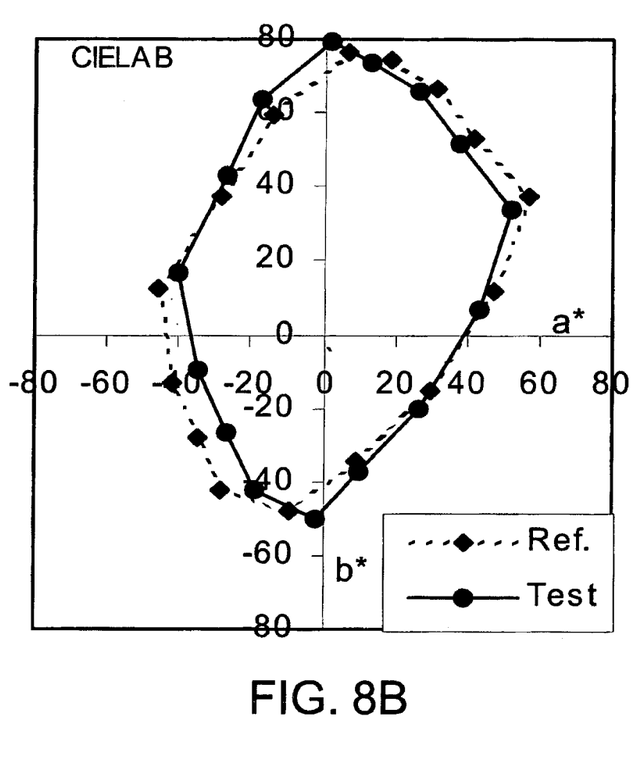
Figure 10A:
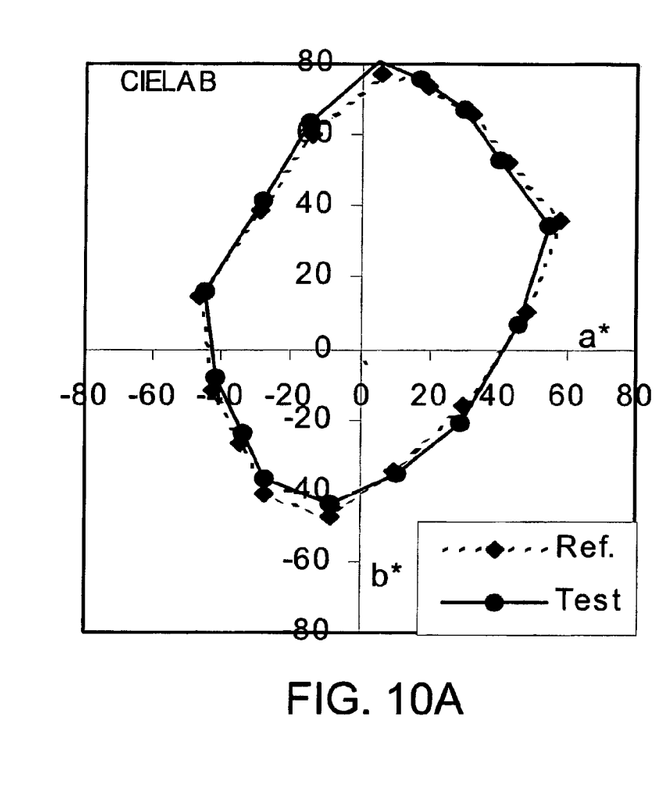
FIGS. 10A and 10B show the color coordinates of 15 test color samples in CIELAB color space for both spectra from FIG. 9 versus those for a reference CIE illuminant.
Figure 10B:
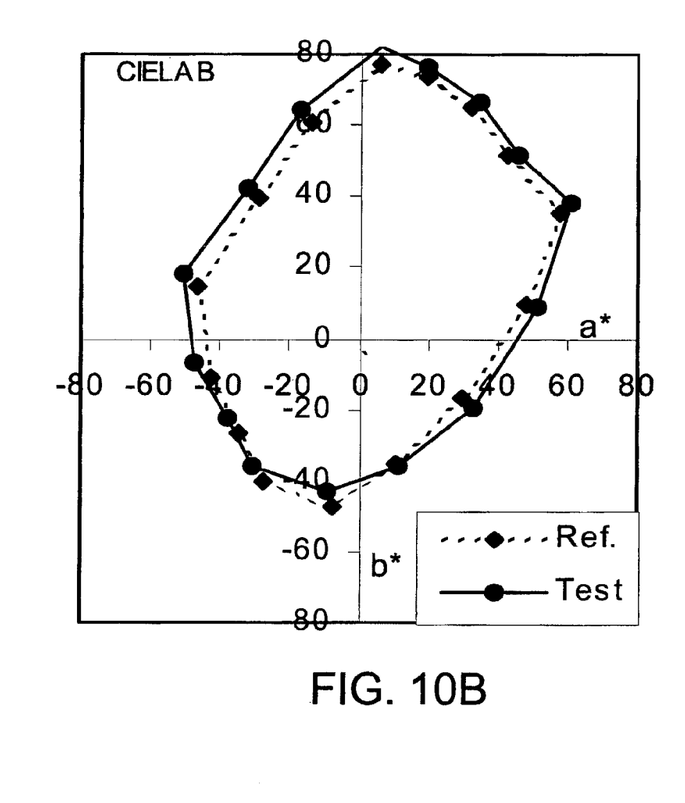

FIGS. 6, 8 and 10 were generated using an Excel spreadsheet generously provided by Dr. Yoshihiro Ohno: W. Davis and Y. Ohno, "Toward an improved color rendering metric", in *Fifth International Conference on Solid State Lighting*, edited by I. T. Ferguson, J. C. Carrano, T. Taguchi, I. E. Ashdown, Proc. SPIE 5941, 59411G, 2005.

Figure 7:
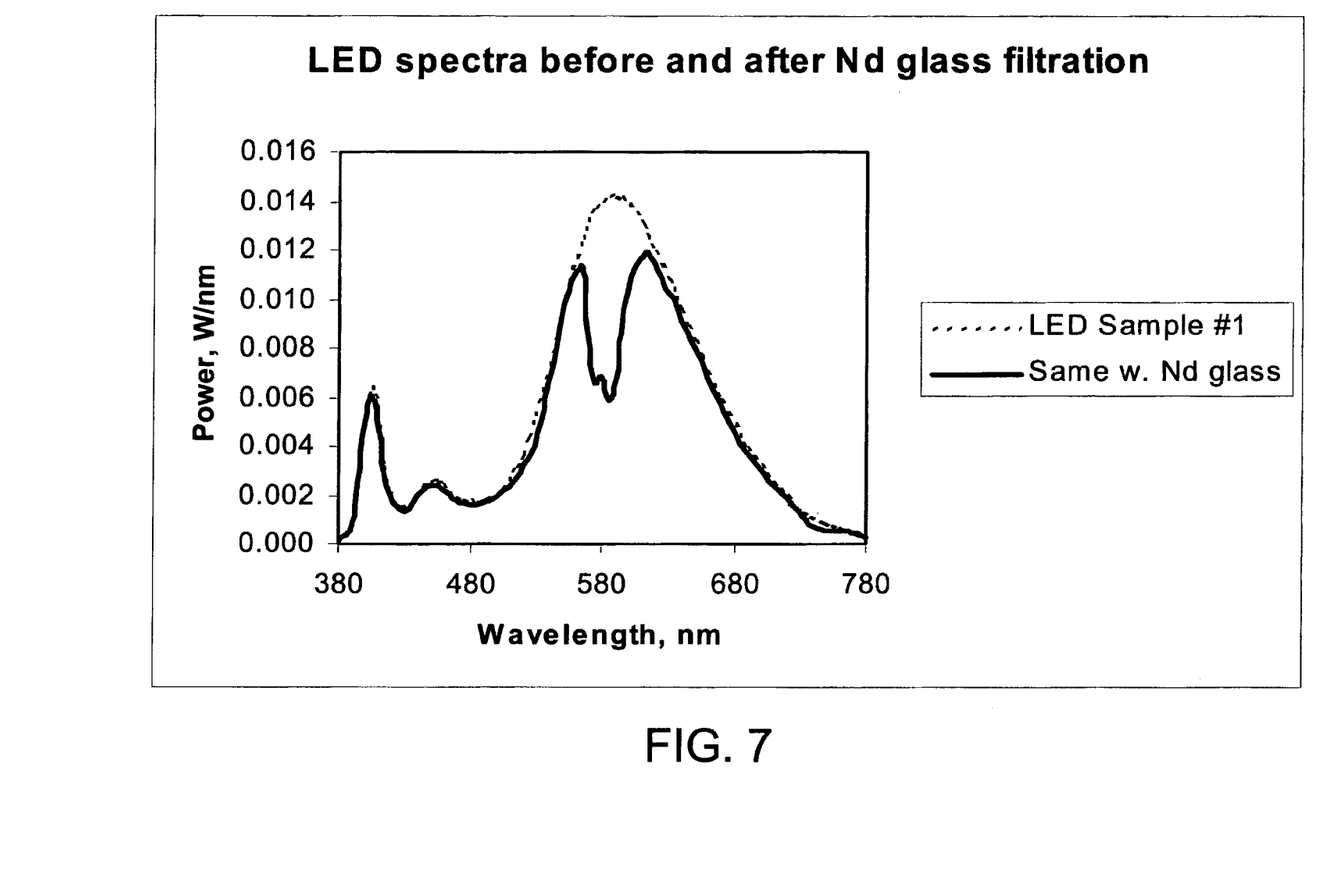
FIG. 7 shows the power spectra for an example white LED, both with and without Nd glass filter.

FIG. 7 shows a representative spectrum of an LED sample with a low CRI (item 2 in table 1 above designated "LED sample #1"). Unexpectedly, the CRI value of this sample increases from 66 to 80 upon filtration through Nd glass. CRI values of 80 and above are often required for illumination quality light sources. This unexpected benefit can be explained by considering the graphs in FIG. 8, which shows the color coordinates of the 15 test color samples in CIE color space for both the reference illuminant and LED sample 1, both without (8A) and with (8B) Nd glass. The effect of filtration is in the same direction as with the Reveal™ lamp, but in this case it leads to the color points of the test color samples approaching those for the reference illuminant from the inside. Samples 2 and 3 show similar behavior.

Figure 9:
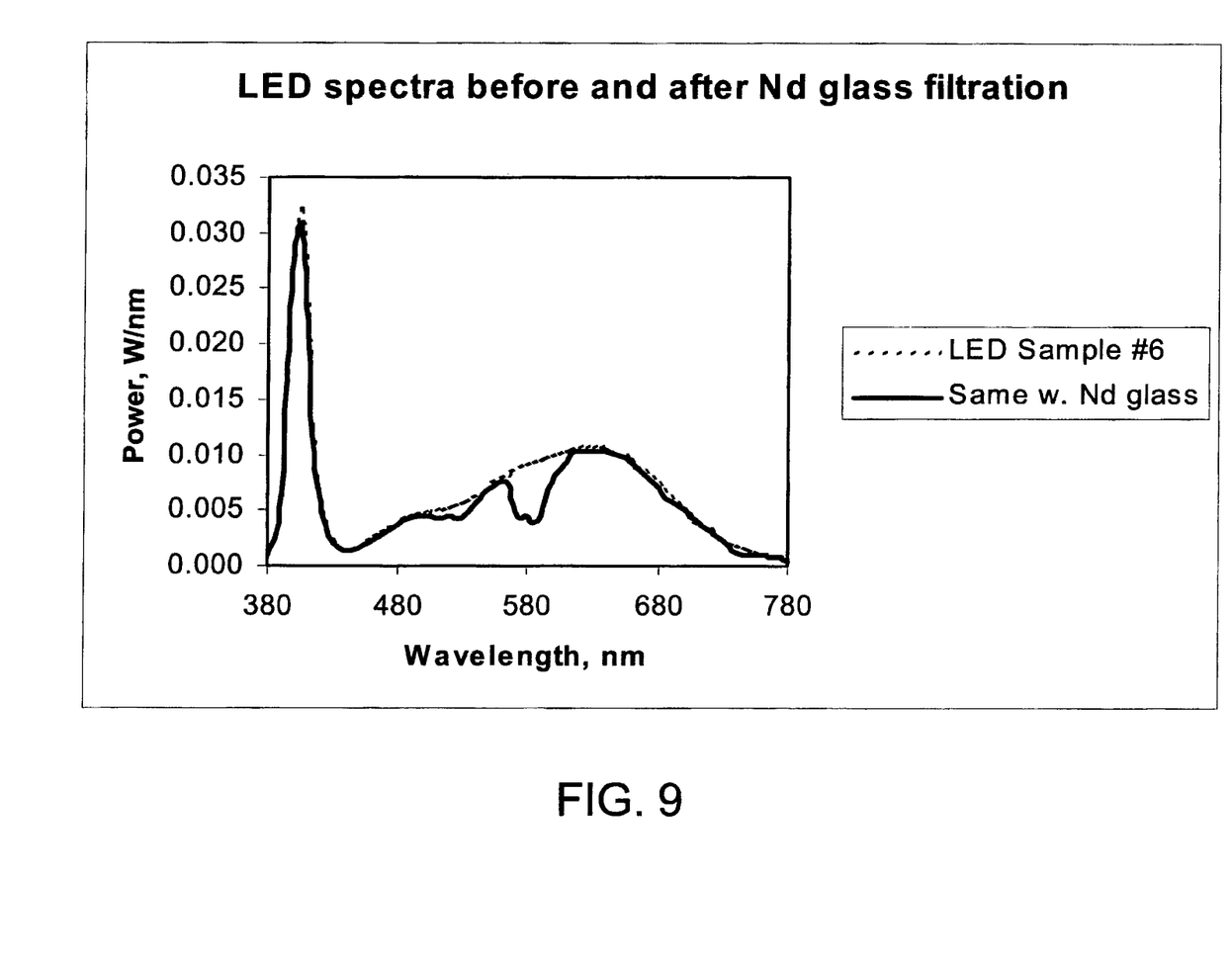
FIG. 9 shows the power spectra for another example white LED, both with and without Nd glass filter.

By contrast, samples with a high starting CRI (as the representative example in FIG. 9, LED sample #6 from table 1) yield color coordinates very close to that of the reference illuminant without Nd glass filtration (FIG. 10 A), and filtration by Nd glass has the same effect of extending the red-green color contrast outside the gamut of the reference illuminant (FIG. 10 B), with a penalty on the CRI value, similarly to the Reveal™ lamp. The remaining examples exhibit this effect at various CCTs ranging from 2500 to 7500K.

Figure 11:
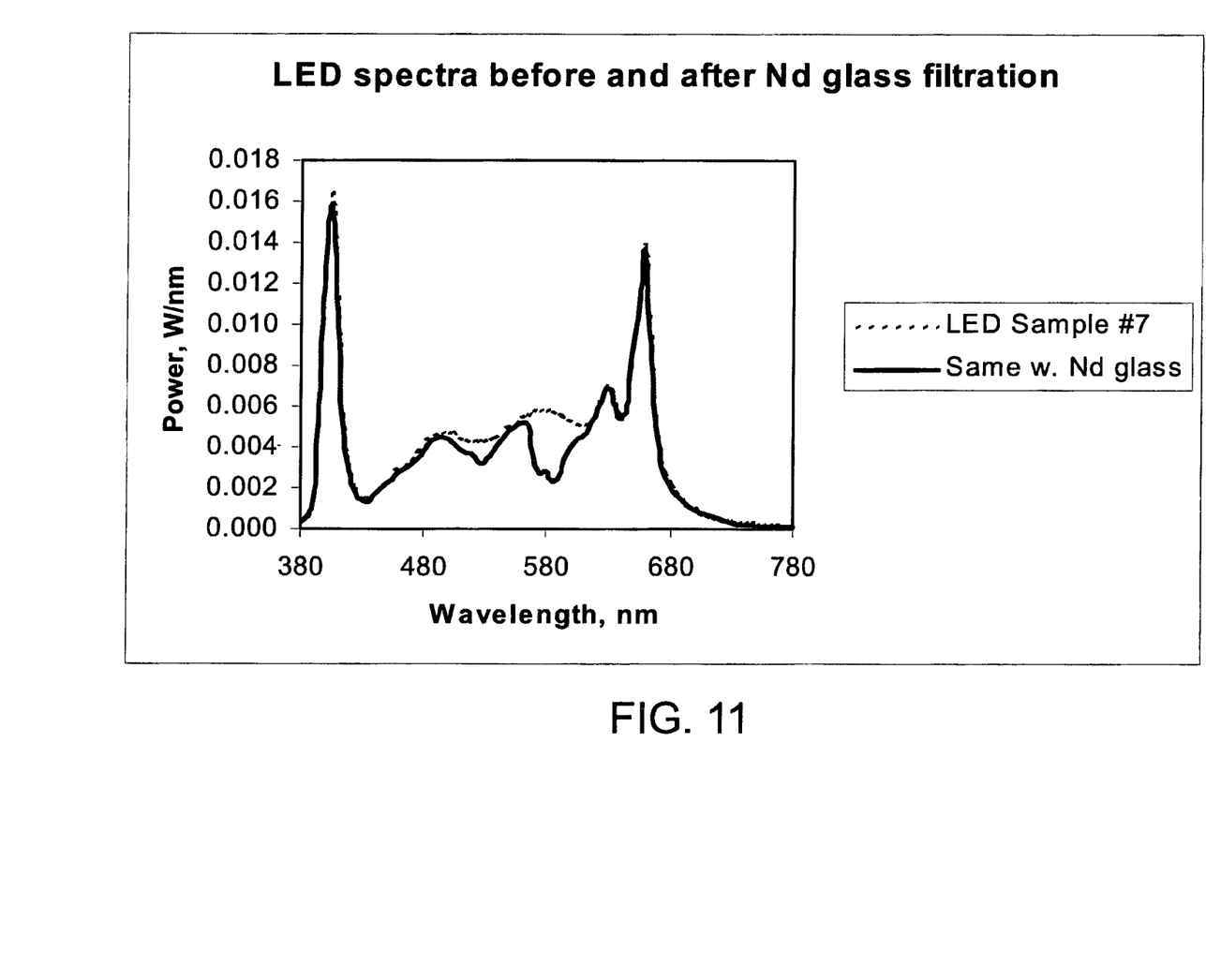
FIG. 11 shows the power spectra for yet another example white LED, both with and without Nd glass filter.
Figure 12A:
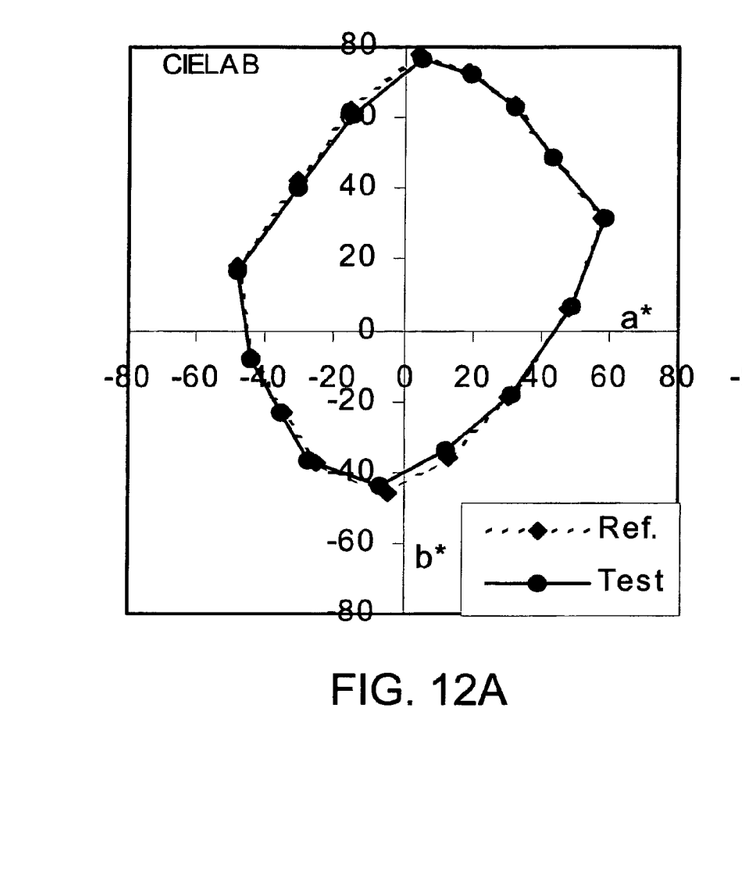
FIGS. 12A and 12B show the color coordinates of 15 test color samples in CIELAB color space for both spectra from FIG. 11 versus those for a reference CIE illuminant.
Figure 12B:
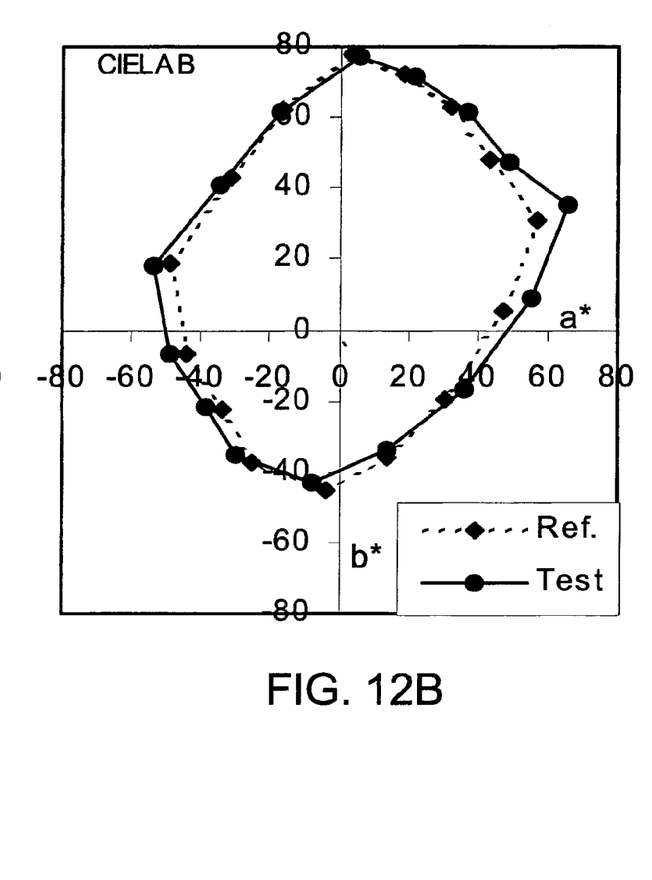

FIGS. 11 and 12 A/B demonstrate the presence of the red-green color contrast enhancement when a deep red line emitting phosphor is used to attain high initial CRI, as opposed to a deep red broadband emitter phosphor, as mentioned earlier.

The invention has been described with reference to the preferred embodiments. Obviously, modifications and alterations will occur to others upon reading and understanding the preceding, detailed description. It is intended that the invention be construed as including all such modifications and alterations, insofar as they come within the scope of the appended claims or the equivalents thereof.

What is claimed is:

1. A lighting apparatus for emitting white light having enhanced red-green color contrast and comprising:
   a semiconductor light source emitting radiation having a peak emission in the range of from about 250 to 500 nm;
   a phosphor material radiationally coupled to said light source comprising a first phosphor having a peak emission between about 550 to 615 nm, a second phosphor being a red phosphor having a peak emission in the range of from about 615 nm to 670 nm, and a third phosphor being a blue phosphor having a peak emission the range of from about 450 to 550 nm;
   a filter comprised of a layer of neodymium glass that prevents a portion of radiation emitted by the first phosphor material from being emitted by the apparatus while substantially permitting the emission of radiation from the lighting apparatus in emission wavelengths other than between 550 and 615 nm; and
   wherein said filter is at least one of embedded in an encapsulant surrounding said phosphor material, positioned on top of an encapsulant or shell surrounding said phosphor material, and positioned directly on a layer of said phosphor material.

2. The lighting apparatus of claim 1, wherein said filter functions such that an overall emission spectrum of the lighting apparatus has a depression between about 550 and 615 nm, said depression extending to between about 5% and 25% of the highest intensity of the emission spectrum of the lighting apparatus in the region from 400 to 700 nm.

3. The lighting apparatus of claim 2, wherein the depression extends to between about 10% and 20% of the highest intensity of the emission spectrum of the lighting apparatus in the region from 400 to 700 nm.

4. The lighting apparatus of claim 1, wherein said first phosphor comprises at least one of a garnet phosphor doped with $Ce^{3+}$ and a silicate phosphor doped with $Eu^{2+}$.

5. The lighting apparatus of claim 1, wherein said lighting apparatus has a general ($R_a$) CRI of at least 80.

6. The lighting apparatus of claim 1, wherein said light source has a peak emission at a wavelength less than 450 nm.

7. The lighting apparatus of claim 1, wherein said red phosphor comprises at least one of $3.5MgO*0.5MgF_2*GeO_2:Mn^{4+}$, $Ca_{1-2e-f}Ce_e(Li,Na)_eEu_fAlSiN_3$, where $0 \le e \le 0.2$, $0 \le f \le 0.2$, $e+f>0$; or $Ca_{1-g-h-i}Ce_g(Li,Na)_hEu_iAl_{1+g-h}Si_{1-g+h}N_3$ where $0 \le g \le 0.2$, $0 < h \le 0.4$, $0 \le i \le 0.2$, $g+i>0$; $CaAlSiN_3:Eu^{2+}$ and $A_2[MF_6]:Mn^{4+}$ where A=Li, Na, K, Rb or Cs and M=Ge, Si, Sn, Ti or Zr.

8. The lighting apparatus of claim 1, wherein said semiconductor light source comprises a nitride compound semiconductor represented by the formula $In_iGa_jAl_kN$, where $0 \le i$; $0 \le j$, $0 \le k$, and $i+j+k=1$.

9. The lighting apparatus of claim 1, wherein the phosphor material is at least one of coated on the surface of the light source, and dispersed in an encapsulant surrounding the light source and the phosphor material.

10. The lighting apparatus of claim 1, further comprising a reflector.

11. The lighting apparatus of claim 1, wherein said layer is continuous.

12. The lighting apparatus of claim 1, wherein said apparatus has a CCT of from 2500 to 7500 K.

13. The lighting apparatus of claim 1, wherein a CCT of said apparatus is higher than 3000K.

14. The lighting apparatus of claim 1, wherein a color point of said apparatus lies substantially on the black body locus within 0.020 units in the vertical direction on the 1931 CIE Diagram.

15. The lighting apparatus of claim 1, wherein said neodymium glass includes between about 1 and 10% by weight $Nd_2O_3$.

16. The lighting apparatus of claim 11, wherein said continuous layer has a thickness between about 0.5 and 1.5 mm.

17. The lighting apparatus of claim 1, having a revealness of at least about 88.

18. The lighting apparatus of claim 1, wherein said filter provides a revealness increase of at least about 21.

19. The lighting apparatus of claim 1, having a gamut area index (GAI) of at least about 43.

20. The lighting apparatus of claim 1, wherein said filter provides a gamut area index (GAI) increase of at least about 12.

21. The lighting apparatus of claim 1, wherein said filter provides increased red-green light contrast.

22. A method for making a lighting apparatus for emitting white light having enhanced red-green color contrast, the method including the steps of:
providing a light source emitting radiation having a peak emission at from about 250 to 500 nm;
providing a phosphor material comprising: a first phosphor material having a peak emission between about 550 and 615 nm, a second phosphor being a red phosphor having a peak emission in the range of from about 615 nm to 670 nm, and a third phosphor being a blue phosphor having a peak emission the range of from about 450 to 550 nm;
radiationally coupling said phosphor material to said light source, and
forming a filter comprised of a neodymium glass layer that prevents a portion of radiation emitted by the phosphor material from being emitted by the apparatus while substantially permitting the emission of radiation from the lighting apparatus in emission wavelengths other than between 550 and 615 nm and associating said layer with said light source.

23. The method of claim 22, wherein said filter functions such that an overall emission spectrum of the lighting apparatus has a depression between about 550 and 615 nm, said depression extending to between about 5% and 25% of the highest intensity of the emission spectrum of the lighting apparatus in the region from 400 to 700 nm.

24. A light bulb including an optical element shaped to receive at least some light from at least one LED, wherein the optical element forms an external surface of the light bulb spaced remotely located from the at least one LED and defines an interior containing the LED and wherein the optical element filters the light to exhibit a spectral notch after being affected by the optical element, and wherein the optical element comprises
a filtering material comprised of neodymium containing $SiO_2$ glass which is of at least a portion of light emitted by the LED and which filters at least a portion of the transmissive light to exhibit a spectral depression.

25. The optical element of claim 24 wherein the light is visible.

26. The optical element of claim 25 wherein the spectral notch occurs between the wavelengths of 550 nm and 615 nm.

27. The optical element of claim 24 further comprising phosphor material to receive at least a portion of emissions in association with at least one LED chip.

28. An LED system comprising: at least one LED; and a filter according to claim 1 arranged to affect light form the at least one LED; wherein light intensity is comparatively reduced by the optical element within a predetermined portion of a visible spectrum of light emitted by the LED system.

29. The LED system of claim 28, further comprising at least one phosphor and wherein the light is emitted by the at least one LED in combination with the at least one phosphor.

30. The LED system of claim 28, wherein the light intensity is comparatively reduced by a peak amount between 5% and about 25%.

31. The LED system of claim 28, wherein a center wavelength for the spectral notch is between 550 and 615 nm.

32. The LED system of claim 28 wherein said filter comprises a part of a light fixture enclosing the at least one LED.

* * * * *

UNITED STATES PATENT AND TRADEMARK OFFICE
CERTIFICATE OF CORRECTION

PATENT NO. : 9,954,145 B2
APPLICATION NO. : 14/295486
DATED : April 24, 2018
INVENTOR(S) : Radkov et al.

It is certified that error appears in the above-identified patent and that said Letters Patent is hereby corrected as shown below:

In the Claims

Column 14, Line 37, in Claim 24 add the word "transmissive" between "is" and "of".

Column 14, Line 39, in Claim 24 remove the word "transmissive".

Signed and Sealed this
Tenth Day of July, 2018

Andrei Iancu
*Director of the United States Patent and Trademark Office*